United States Patent [19]

Inoue

[11] Patent Number: 5,449,634
[45] Date of Patent: Sep. 12, 1995

[54] METHOD OF FABRICATING NON-VOLATILE SEMICONDUCTOR MEMORY DEVICE

[75] Inventor: Tatsuro Inoue, Tokyo, Japan
[73] Assignee: NEC Corporation, Tokyo, Japan
[21] Appl. No.: 141,882
[22] Filed: Oct. 27, 1993

[30] Foreign Application Priority Data

Oct. 27, 1992 [JP] Japan .................. 4-288043

[51] Int. Cl.6 ........................ H01L 21/8247
[52] U.S. Cl. ........................ 437/52; 437/43; 437/44
[58] Field of Search ............ 437/43, 44, 48, 52; 257/315-323

[56] References Cited

U.S. PATENT DOCUMENTS

| | | | |
|---|---|---|---|
| 4,373,249 | 2/1983 | Kosa et al. | 437/48 |
| 4,775,642 | 10/1988 | Chang et al. | 437/44 |
| 5,175,120 | 12/1992 | Lee | 437/48 |

FOREIGN PATENT DOCUMENTS

| | | | |
|---|---|---|---|
| 0379450 | 7/1990 | European Pat. Off. | |
| 0050771 | 3/1983 | Japan | 437/43 |
| 58-184768 | 10/1983 | Japan | |
| 0045165 | 2/1987 | Japan | 437/43 |
| 0126279 | 5/1988 | Japan | 437/43 |
| 0259566 | 10/1989 | Japan | 437/52 |
| 2188969 | 7/1990 | Japan | |
| 0125479 | 5/1991 | Japan | 437/52 |

OTHER PUBLICATIONS

Patent Abstracts of Japan, vol. 8, No. 21 (E-224), Jan. 28, 1984.
Patent Abstracts of Japan, vol. 14, No. 463 (E-0988), Oct. 8, 1990.

Primary Examiner—Tom Thomas
Attorney, Agent, or Firm—Sughrue, Mion, Zinn, Macpeak & Seas

[57] ABSTRACT

An MOS transistor having an LDD structure is constructed in a first active region for a peripheral circuit in alignment with a first gate, by using as a mask a second active region for a memory cell. After forming a first interlayer insulating layer, a second gate having a floating gate and a control gate is formed in the second active region. A third insulating layer formed on the surface including the second gate is patterned to form a contact hole bounded by a sidewall of a side face of the second gate.

7 Claims, 11 Drawing Sheets

METHOD OF FABRICATING NON-VOLATILE SEMICONDUCTOR MEMORY DEVICE

BACKGROUND OF THE INVENTION

1. Field of the Invention

The present invention relates to a method of manufacturing a non-volatile semiconductor memory device and, particularly, to a method of manufacturing a semiconductor memory device comprising, on a substrate, a non-volatile memory transistor having a double layer gate electrode structure and a transistor having a single layer gate electrode structure for a peripheral circuit.

2. Description of the Prior Art

A non-volatile semiconductor memory device, as exemplified by an EPROM which has a double layer gate electrode structure, is under development, and, recently, its cell integration density and cell size have been rapidly increasing and reducing, respectively.

There are various recent proposals concerning increase of integration density of the EPROM, one of which is a self align contact (SAC) in which a contact to a source region of a memory transistor is formed in a side wall provided on a side face of the memory transistor in a self align method. Another proposal is to provide, for reducing the gate size of a transistor for a peripheral circuit, an LDD (Lightly Doped Drain) structure having a low impurity density diffusion layer region in the adjacent of an edge portion of a transistor gate.

It is known, in an EPROM, to form on a single substrate a memory cell, comprising a double layer gate transistor having a floating gate, and a single layer gate transistor for a peripheral circuit.

A method of manufacturing a conventional non-volatile semiconductor will be described with reference to FIG. 1a to 1l.

Figure 1A:
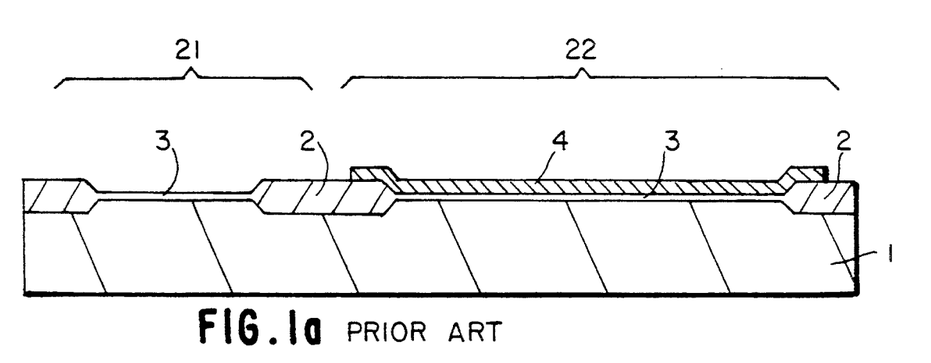
FIGS. 1a to 1l are cross sections of a semiconductor chip, showing conventional manufacturing steps.

First, as shown in FIG. 1a, a peripheral circuit active region 21 and a memory cell active region 22 are separated by providing a field oxide 2 on a surface of a semiconductor substrate 1 of silicon, and then a first gate insulating layer 3 is formed on the active regions 21 and 22. Thereafter, a polysilicon (poly-crystalline silicon) layer is deposited thereon, and a first electrode layer 4 is formed on the active region 22 by patterning the polysilicon layer.

Figure 1B:
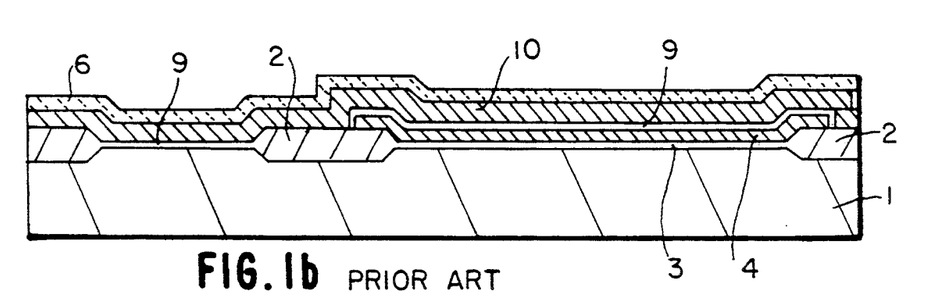

Then, as shown in FIG. 1b, the first gate insulating layer 3 on only the active region 21 is removed, and a second gate insulating layer 9 of silicon oxide is formed on the semiconductor substrate 1 and the first electrode layer 4 to form a second electrode layer 10 of polysilicon. Then, a first insulating layer 6 of silicon oxide is formed on the whole surface. The first insulating layer 6 functions to insulate a control electrode gate of the memory cell transistor from an SAC during formation of the transistor.

Figure 1C:
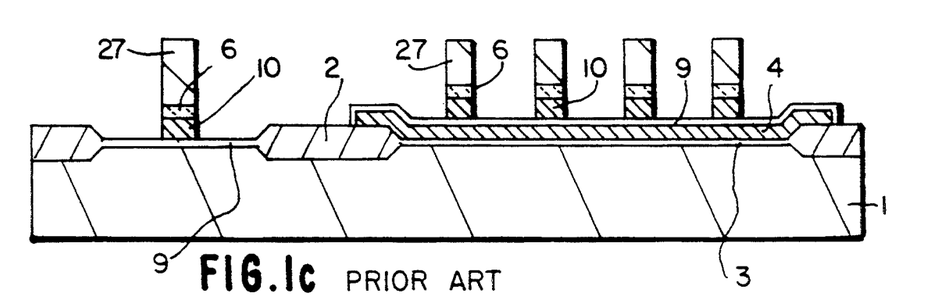

Then, as shown in FIG. 1c, a patterned photoresist layer 27 is formed on the first insulating layer 6. The first insulating layer 6 and the second electrode layer 10 are sequentially etched by using the patterned photoresist layer 27 as a mask to form an electrode gate of the active region 22.

Figure 1D:
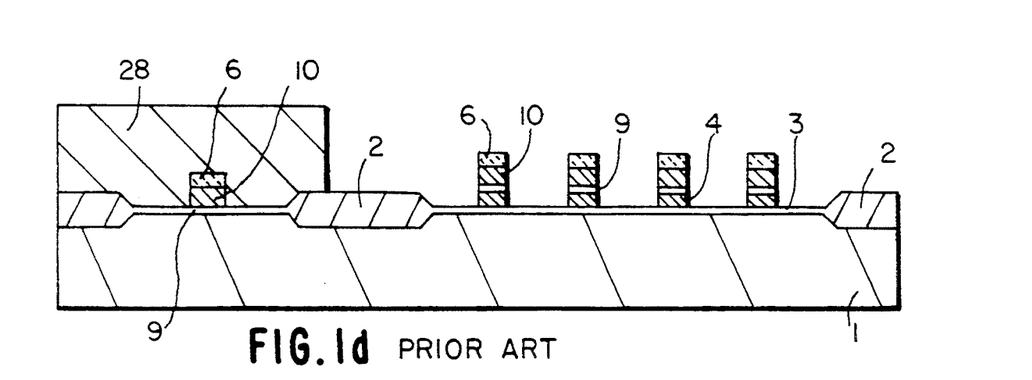

Thereafter, as shown in FIG. 1d, the photoresist layer 27 is removed, and a photoresist layer 28 covering the active region 21 is formed selectively. The second gate insulating layer 9 and the first electrode layer 4 are sequentially etched away by using the first insulating layer 6 as a mask. With this step, there is formed a second electrode gate having the control gate and a floating gate.

Figure 1E:
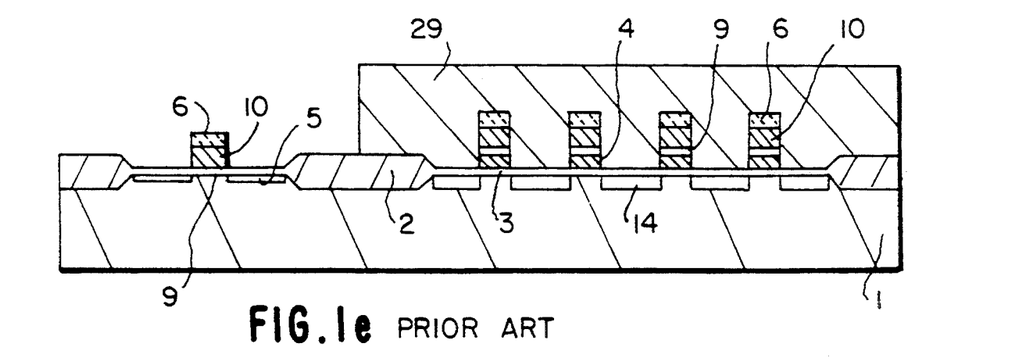

Then, as shown in FIG. 1e, a cell source/drain region 14 is formed by using the photoresist layer 28 and the second electrode gate on the active region 22 as a mask. Thereafter, the photoresist layer 28 is removed, and a photoresist layer 29 covering the active region 22 is formed. A low impurity density source/drain region 5 is formed by using the photoresist layer 29 and the electrode gate on the active region 21.

Figure 1F:
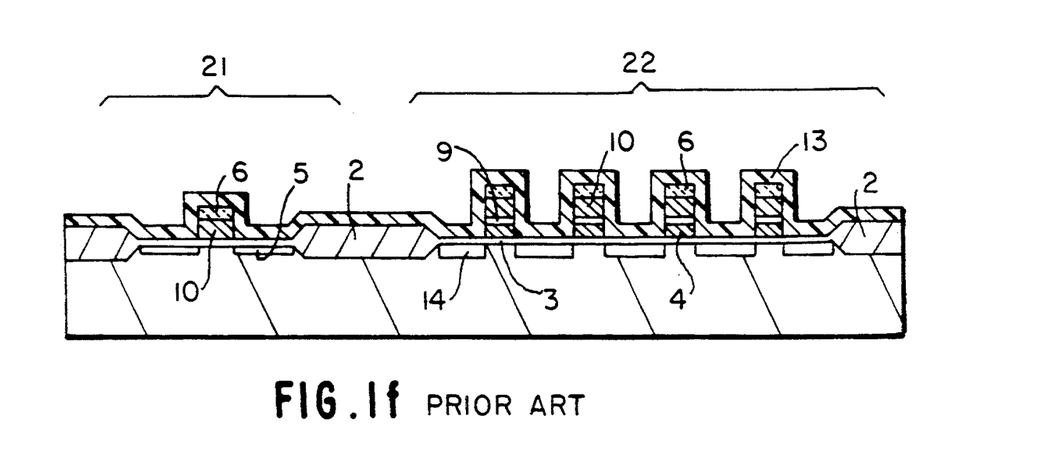

Thereafter, as shown in FIG. 1f, the photoresist layer 29 is removed, and then a second insulating layer 13 of silicon oxide is formed on the whole surface. The photoresist layer 29 is necessary to form side walls on side faces of the gate when the LDD structure of the transistor for the peripheral circuit is provided.

Figure 1G:
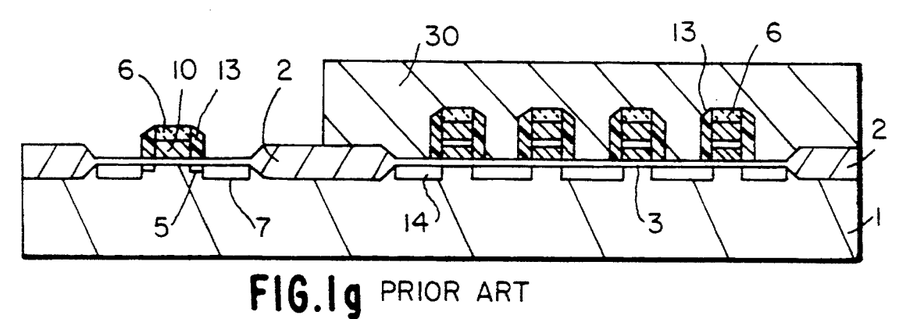

Then, as shown in FIG. 1g, the side walls are formed on the side faces of the gate on the active regions 21 and 22 by etching back the second insulating layer 13, and then a photoresist layer 30 is formed. The photoresist layer 30 is patterned so that it covers the active region 22, and a source/drain region 7 in the active region 21 is formed with the gate including the side-wall as a mask, resulting in the transistor having an LDD structure for the peripheral circuit.

Figure 1H:
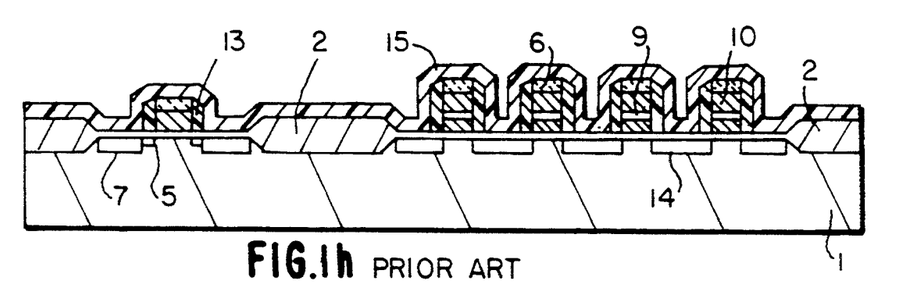

Then, as shown in FIG. 1h, the photoresist layer 30 is removed, and a third insulating layer 15 of silicon oxide is formed on the whole surface. The third insulating layer 15 is necessary to form side walls on side faces of the gate of the memory cell transistor and also is necessary to form the SAC of the memory cell transistor.

Figure 1I:
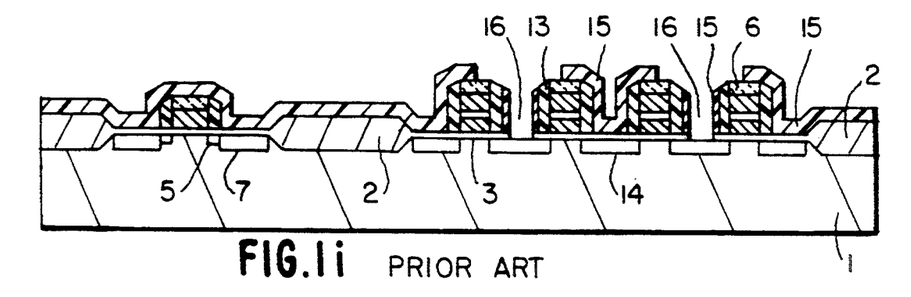

Then, as shown in FIG. 1i, the third insulating layer 15 is etched back with a photoresist layer (not shown), selectively provided as a mask such that only the source side of the transistor in the active region 22 is exposed, and, further, the first gate insulating layer 3 is also etched to form a first contact hole 16 in the third insulating layer 15 on the side face of the gate of the memory cell transistor on the source side thereof.

Figure 1J:
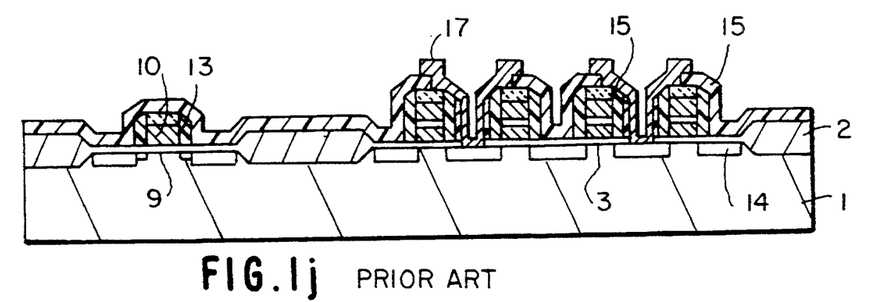

Then, as shown in FIG. 1j, a tungsten silicide layer is deposited on the whole surface, and a source electrode 17 is formed by patterning the silicide layer.

Figure 1K:
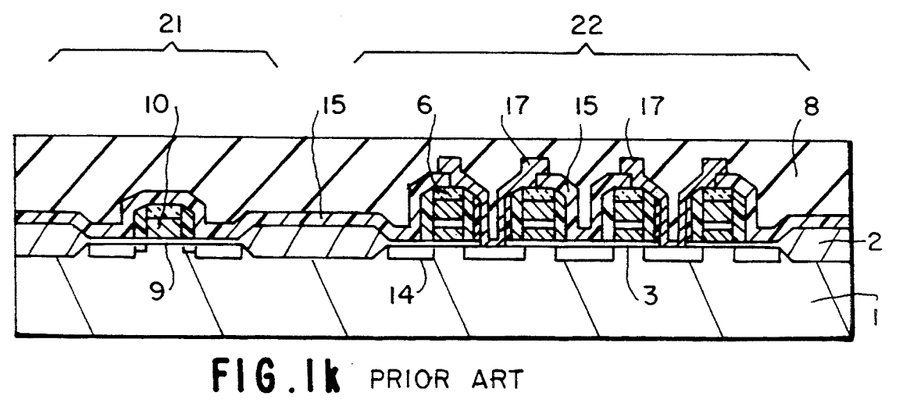

Then, as shown in FIG. 1k, a first interlayer insulating layer 8 of TEOS BPSG is formed on the whole surface.

Figure 1L:
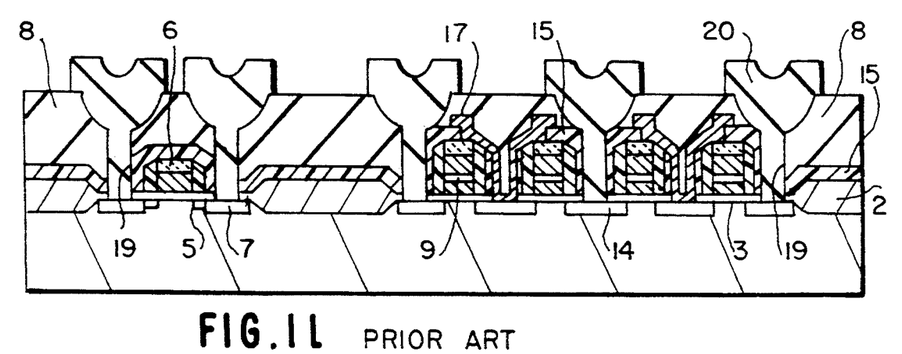

Thereafter, as shown in FIG. 1l, a second contact hole 19 is formed on the interlayer insulating layer 8, and then a metal electrode 20 of aluminum, etc., is selectively formed.

The above described method of manufacturing a non-volatile semiconductor memory device has the following problems:

(A) Since the gate insulating layer on the floating gate of the memory cell transistor and the gate insulating layer of the transistor for the peripheral circuit are formed simultaneously, it is impossible to obtain optimum layer quality and layer thickness for the respective transistor.

The same method of manufacturing a non-volatile semiconductor memory device is disclosed in U.S. Pat. No. 4,775,642 issued Oct. 4, 1988. This patent discloses that the gate insulating layer, on the floating gate, and the gate insulating layer of the transistor for the peripheral circuit are formed simultaneously.

(B) For the same reason, it is necessary to form the insulating layer 6, for insulating the control gate from the SAC of the memory cell transistor, in forming the SAC, before formation of the control gate electrode. As a result, the insulating layer 6, also formed on the gate of the transistor for the peripheral circuit region, is degraded.

(C) The sidewall which is necessary to provide the transistor for the peripheral circuit with the LDD structure is also formed on the side faces of the gate of the memory cell transistor. Therefore, when sidewalls are formed for protection of the side faces of the gate, which sidewalls are necessary in forming the SAC of the memory cell transistors, the thickness of the sidewall of the memory cell transistor is doubled. As a result, the distance between adjacent sidewalls in the source region becomes small, thereby causing the contact area of the SAC to be small, and leading to an increase of contact resistance.

BRIEF SUMMARY OF THE INVENTION

An object of the present invention is to provide a method of manufacturing a non-volatile semiconductor memory device, which method provides optimum layer quality and layer thickness of a memory cell transistor and a transistor for a peripheral circuit, respectively.

Another object of the present invention is to provide a method of manufacturing a non-volatile semiconductor memory device, which method prevents degradation of flatness of a peripheral circuit region of the device.

A further object of the present invention is to provide a method of manufacturing a non-volatile semiconductor memory device, which method prevents reduction of the contact area of an SAC.

The method of manufacturing a non-volatile semiconductor memory device comprises the steps of;

providing a peripheral circuit active region and a memory cell active region in a surface of a semiconductor substrate, forming a first gate insulating layer on the peripheral circuit active region, forming an MOS transistor, having the first gate insulating layer on the peripheral circuit active region, by using the memory cell active region as a mask, forming a first gate insulating layer on the peripheral circuit active region, forming a second gate insulating layer on the memory cell active region, and forming a non-volatile memory element having the second gate layer on the memory cell active region.

BRIEF DESCRIPTION OF THE DRAWINGS

The above mentioned and other objects, features and advantages of the present invention will become more apparent by reference to the following detailed description of the present invention taken in conjunction with the accompanying drawings, wherein.

DETAILED DESCRIPTION OF THE INVENTION

A first embodiment of the manufacturing method of the present invention will be described with reference to FIG. 2a to 2n.

Figure 2A:
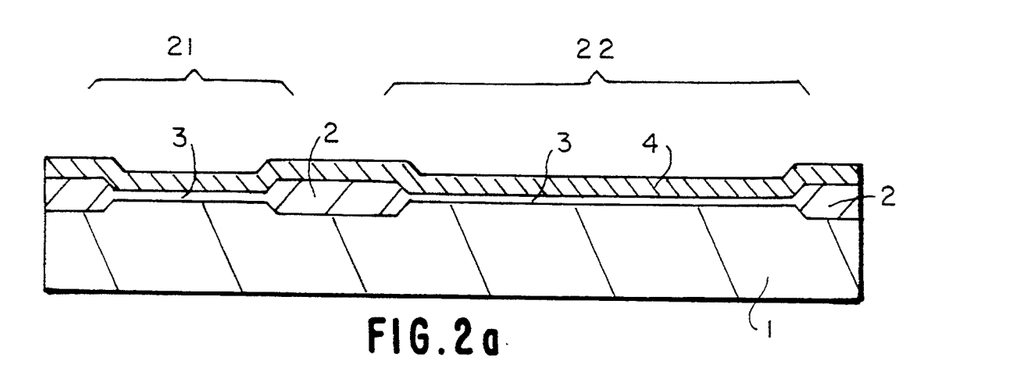
FIGS. 2a to 2n are cross sections of a semiconductor chip, showing manufacturing steps of a first embodiment of the present invention.

First, as shown in FIG. 2a, by forming a field oxide layer 2 having a thickness of 759 nm on a surface of a P type silicon semiconductor substrate 1, a peripheral circuit active region 21 and a memory cell active region 22 are partitioned from each other. Then, a first gate insulating layer 3 having a thickness of 15 nm is formed on the active regions 21 and 22. Then, a first electrode layer 4 of polysilicon containing N type impurity, such as phosphor, and having a thickness of 300 nm is deposited thereon by CVD (chemical-vapor deposition).

Figure 2B:
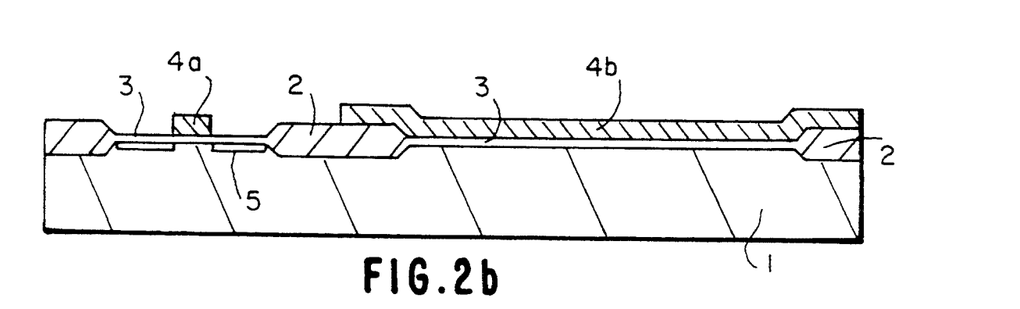

Then, as shown in FIG. 2b, the first electrode layer 4 is patterned by photolithography to form a gate 4a on the active region 21 and a mask layer 4b on the active region 22. Then, a photoresist layer (not shown) is selectively formed to cover the active region 22, through which N type impurity ion such as phosphor is injected at a dose of about $3 \times 10^{13}$ cm$^{-2}$ to form a low impurity density source/drain region 5 in the active region 21.

Figure 2C:
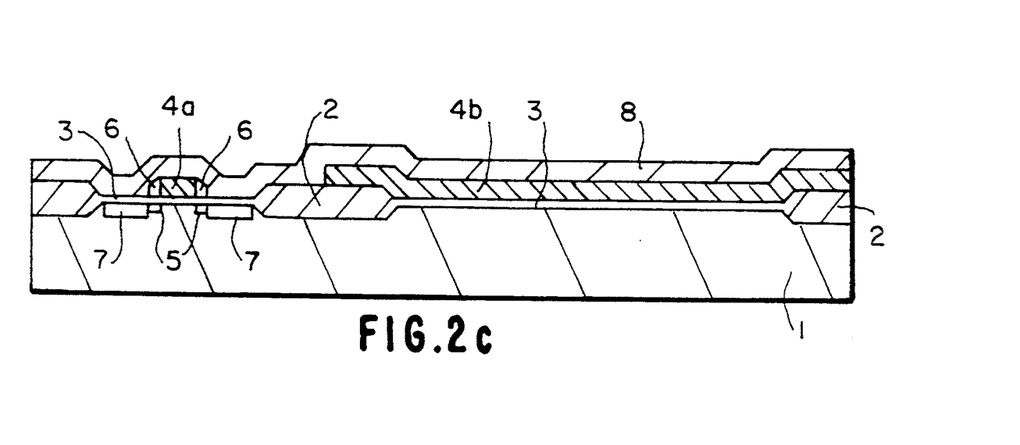

Thereafter, as shown in FIG. 2c, the photoresist layer covering the active region 22 is removed, and a first insulating layer 6 of silicon oxide having thickness of 200 nm is deposited on the whole surface by low pressure CVD. Then, the first insulating layer 6 is etched back to leave a portion thereof on a side face of the gate 4a, and then N type impurity such as arsenic is ion-injected into the active region 21 at a dose of $5 \times 10^{16}$ cm$^{-2}$ by using the gate 4a and the first insulating layer 6 as a mask to form a high impurity density source/drain region 7. Then, a first interlayer insulating layer 8 of $O_3$ TEOS BPSG having thickness of 300 nm is formed by low pressure CVD and is reflowed in a nitrogen atmosphere at 850° C.

Figure 2D:
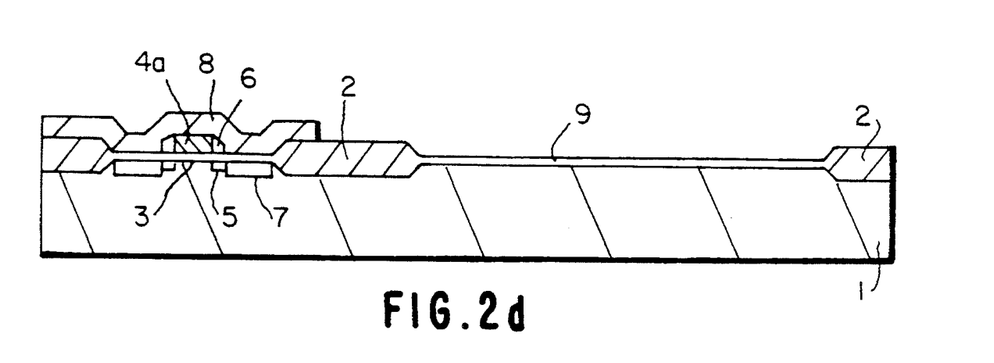

Then, as shown in FIG. 2d, the first interlayer insulating layer 8 is patterned by using photolithography, and thereafter the exposed mask layer 4b and the first gate insulating layer 3 are etched away sequentially. Then, an exposed surface of the active region 22 is thermally oxidized in nitric steam at 750° C., and then a second gate insulating layer 9 of silicon oxide having a thickness of 20 nm is formed on the surface.

Figure 2E:
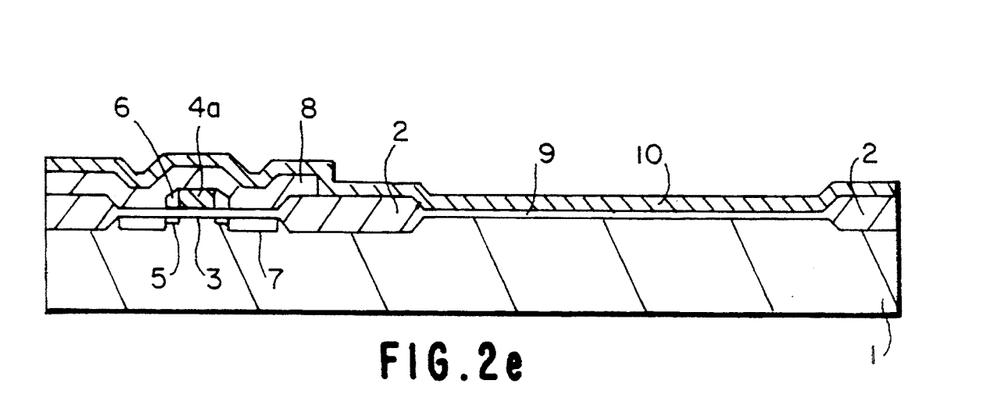

Then, as shown in FIG. 2e, a second electrode layer 10 of polysilicon containing N type impurity such as phosphor and having thickness of 200 nm is formed on the whole surface.

Figure 2F:
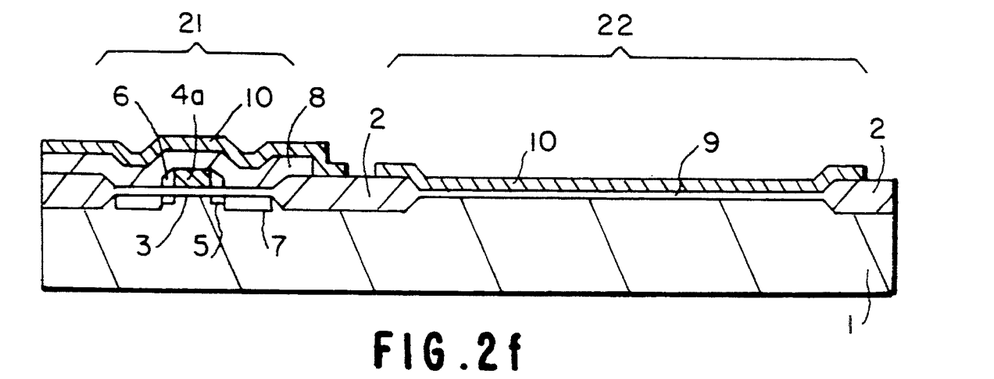

Thereafter, as shown in FIG. 2f, the second electrode layer 10 is patterned by photolithography to isolate that on the active region 21 from that on the active region 22.

Figure 2G:
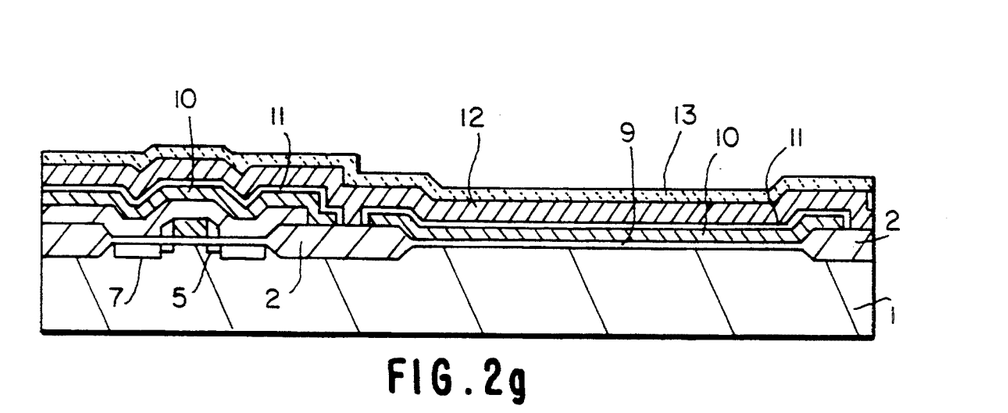

Then, as shown in FIG. 2g, a third gate insulating layer 11 of silicon oxide having a thickness of 20 nm is formed on the surface of the second electrode layer 10 by low pressure CVD. Further, a third electrode layer 12 of polysilicon containing N type impurity such as phosphor and having thickness of 300 nm is formed on the gate insulating layer 11, and a second insulating layer 13 of silicon oxide having a thickness of 250 nm is formed on the third electrode layer 12 by CVD at normal pressure.

Figure 2H:
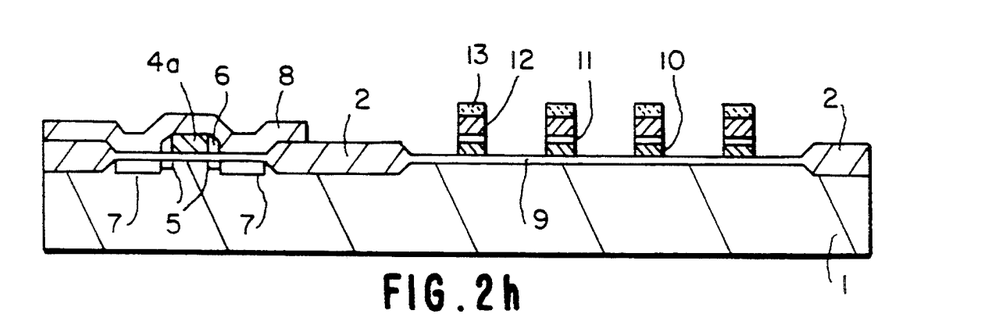

Then, as shown in FIG. 2h, a photoresist layer (not shown) is selectively provided on a portion of the second insulating layer 13 which becomes a control gate of the active region 22, and the second insulating layer 13, the third electrode layer 12, the third gate insulating layer 11 and the second electrode layer 10 are anisotropically etched away sequentially by reactive ion etching by using the photoresist layer as a mask, resulting in gate electrodes. Then, the photoresist layer is removed.

Figure 2I:
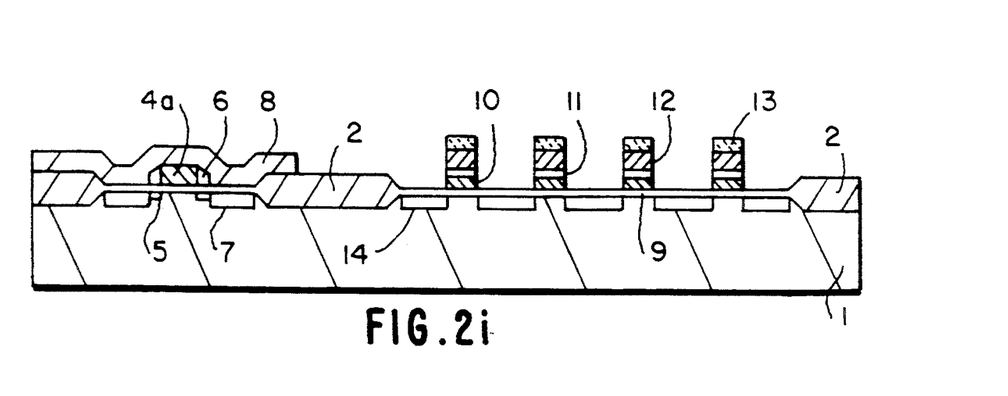

Thereafter, as shown in FIG. 2i, a source/drain region 14 is formed by ion injection N type impurity such as arsenic at a dose of $5 \times 10^{16}$ cm$^{-2}$ by using the gate electrode in the active region 22 as a mask.

Figure 2J:
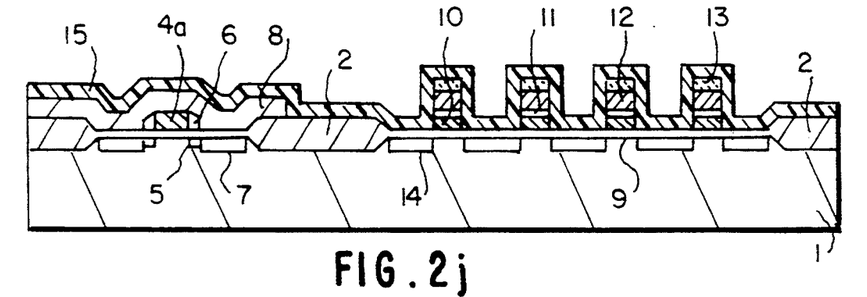

Then, as shown in FIG. 2j, a third insulating layer 15 of silicon dioxide having a thickness of 200 nm is formed on a surface of the active region including the gate electrode by low pressure CVD.

Figure 2K:
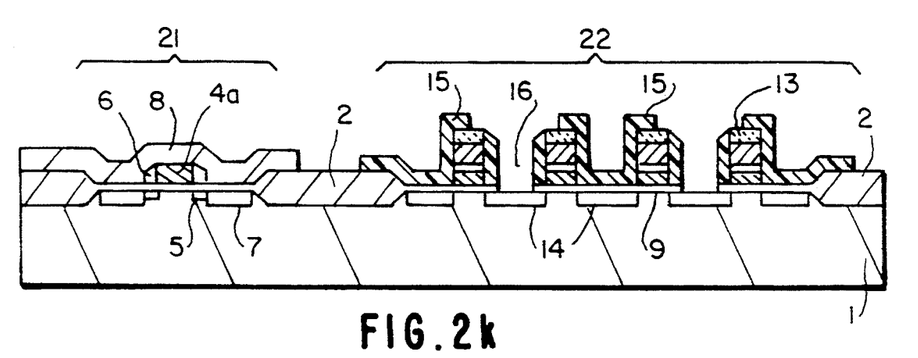

Then, as shown in FIG. 2k, a photoresist layer (not shown) is selectively formed on the third insulating film 15, such that it covers only the drain side of the active region 22, by photolithography, and the third insulating layer 15 is anisotropically etched by its layer thickness by using the photoresist layer as a mask to leave a portion of the insulating layer 15 on the side faces of the gate on the source side of the memory cell transistor and exposing surface portions of the diffusion layer to form first contact holes 16.

Figure 2L:
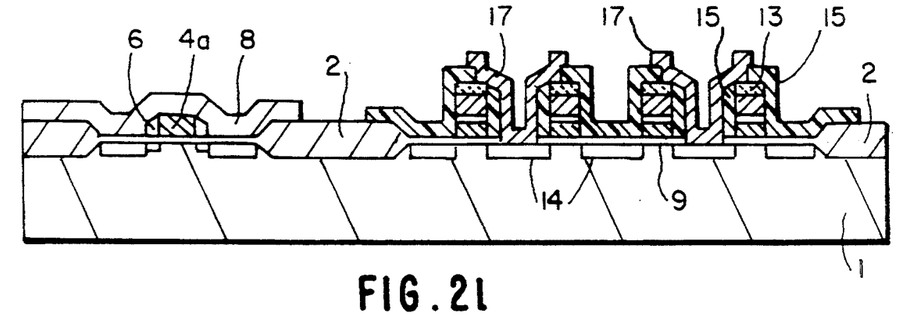

Then, as shown in FIG. 2l a tungsten layer 200 nm thick is deposited on the surface, including the first contact holes 16, by sputtering and patterned to form a source electrode 17 for electrically connecting the source/drain region 14.

Figure 2M:
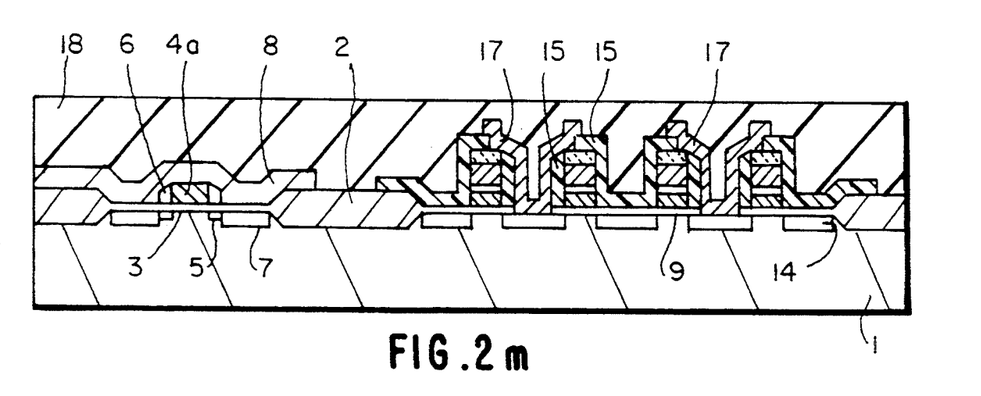

Then, as shown in FIG. 2m, a second interlayer insulating layer 18 of TEOS BPSG having a thickness of 500 um is formed by low pressure CVD reflowed in a nitric atmosphere at 850° C.

Figure 2N:
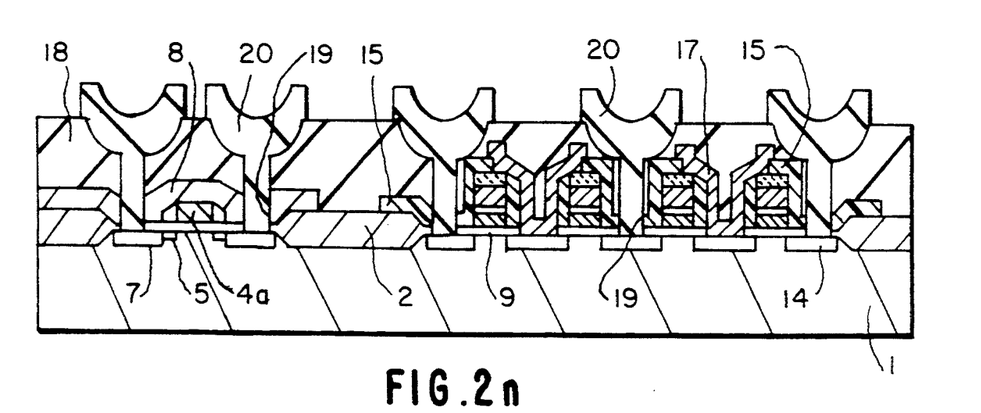

Thereafter, as shown in FIG. 2n, the second interlayer insulating layer 18 is selectively etched to form second contact holes 19, and an aluminum layer is deposited on the surface including the second contact holes 19. The aluminum layer is patterned to form a metal electrode 20.

The non-volatile semiconductor memory device is manufactured by the steps mentioned above.

A second embodiment of the present invention will be described with reference to FIG. 3a to 3d.

Figure 3A:
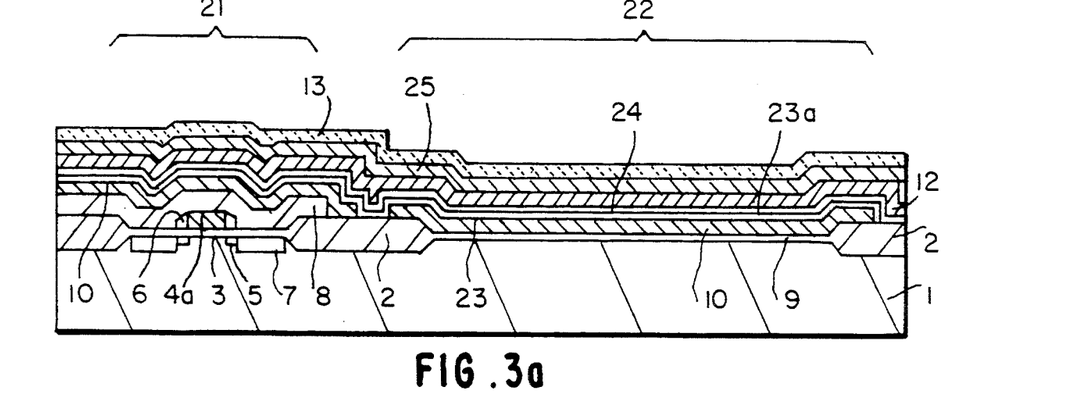
FIGS. 3a to 3d are cross sections of a semiconductor chip, showing manufacturing steps of a second embodiment of the present invention.

First, as shown FIG. 3a, a second electrode layer 10 is formed on first and second active regions 21 and 22 provided in a semiconductor substrate 1 and patterned through steps similar to those of the first embodiment (FIG. 2a to 2f). Then, a silicon oxide layer 23 having a thickness of 7 nm is deposited on the whole surface by low pressure CVD. Thereafter, a silicon nitride layer 24 having a thickness of 7 nm which results from dichlorsilane is deposited thereon by low pressure CVD and further a silicon oxide layer 23a having a thickness of 10 nm is deposited by low pressure CVD, resulting in a third gate insulating layer 11a having a three layer structure. Then, after a third electrode layer 12 of polysilicon containing N type impurity such as phosphor and having thickness of 100 nm is formed, a fourth electrode layer 25 of tungsten silicide having a thickness of 150 nm is formed, and a second insulating layer 13 of silicon oxide and having thickness of 250 nm is formed thereon.

Figure 3B:
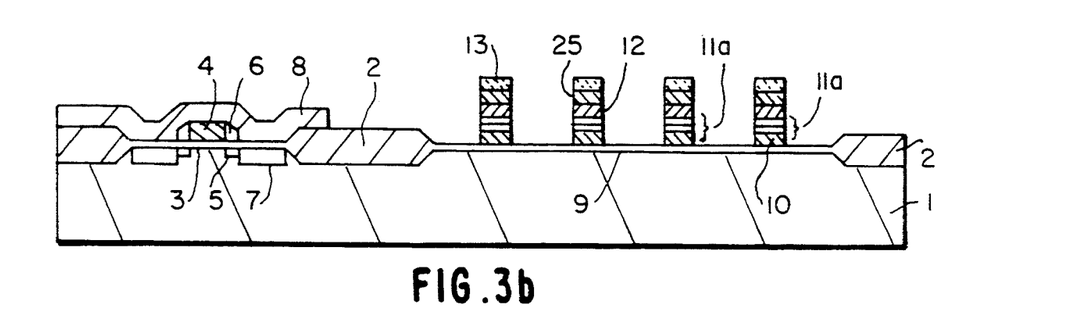

Then, as shown in FIG. 3b, the second insulating layer 13, the fourth electrode layer 25, the third electrode layer 12, the third gate insulating layer 11a, and the second electrode layer 10 are etched away sequentially by using a photoresist layer (not shown) selectively formed on the second insulating layer 13 on the control gate electrode forming region in the active region 22, to form a second gate. Then, the photoresist layer is removed.

Figure 3C:
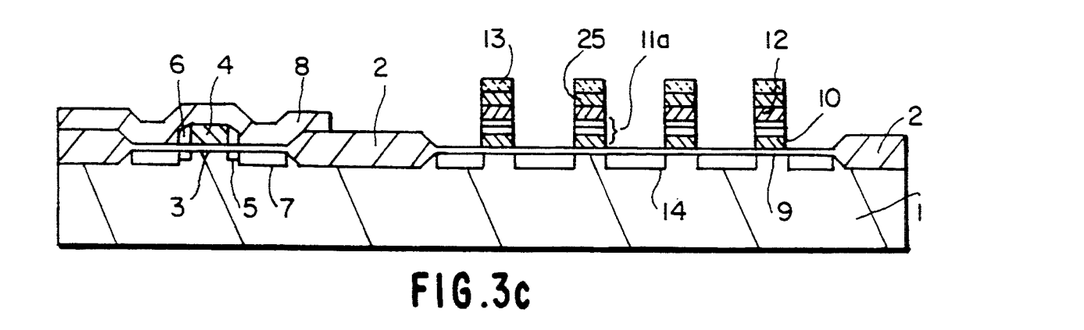

Thereafter, as shown in FIG. 3c, a source/drain region 14 of the memory cell is formed by ion-injecting arsenic to the active region 22 in the semiconductor substrate 1 by using the second gate electrode as a mask.

Figure 3D:
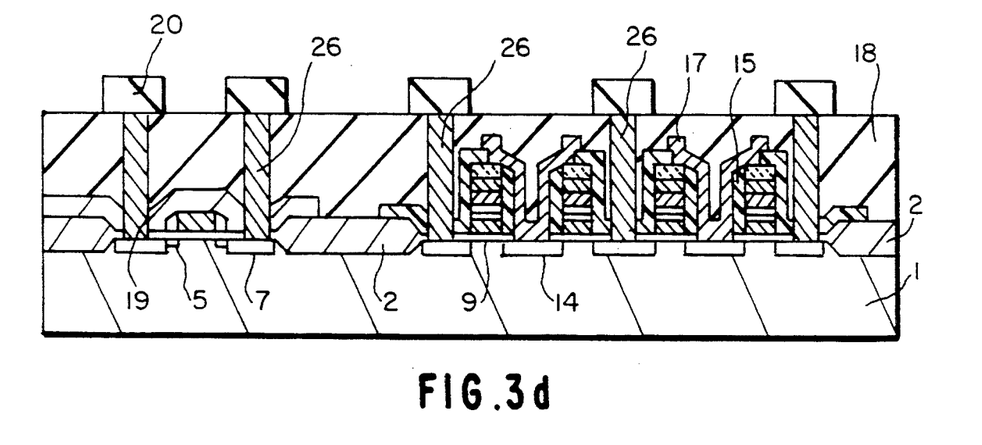

Then, as shown in FIG. 3d, a third insulating layer 15 is formed on the surface of the active region 22 including the second gate and patterned to leave a portion of the insulating layer 15 on the side faces of the gate on the source side of memory cell transistor, while exposing surface portions of the diffusion layers to form first contact holes 16 through similar steps to those of the first embodiment. Then, an interlayer insulating layer 18 is deposited on the whole surface in which a contact hole 19 is formed. A via hole 26 of tungsten is buried in the contact hole 19, and a metal electrode 20 connected to the via hole 26 is formed.

The second embodiment of the present invention has the following merits:

(a) With the three layer structure of the gate insulating layer on the floating gate of the memory cell transistor (which includes the silicon oxide layer, the silicon nitride layer and the silicon oxide layer), flow of electrons from the floating gate to the control gate of the memory transistor, which is written by injecting electrons to the floating gate when high voltage is applied to the control gate, is restricted sufficiently to improve the charge holding characteristics thereof.

(b) With the polycide gate structure of the control gate of the memory cell transistor, it is possible to reduce resistance of the control gate, and thus it is possible to increase the speed of operation.

(c) With the use of a buried contact in the second contact hole (drain contact) of the memory cell transistor, it is possible not only to reduce the manufacturing margin between the gate and the contact hole but also to make the second contact hole smaller.

As described hereinbefore, the present invention, in which, after the peripheral circuit transistor is formed in the first active region by using the second active region as a mask, the memory cell transistor is formed in the second active region while covering only the first active region with the first interlayer insulating layer, provides the following effects:

(1) It is possible to form the gate insulating layer on the floating gate of the memory cell transistor and gate insulating layer of the peripheral circuit transistor with layer quality and layer thickness thereof as desired, respectively.

(2) Since it is unnecessary to form an insulating layer on the gate of the peripheral circuit transistor for formation of the SAC of the memory cell transistor, the flatness of the peripheral circuit region can be improved.

(3) The sidewall formed on the side face of the gate of the peripheral circuit transistor is not formed on the gate of the memory cell transistor. Since, therefore, the sidewall for formation of the SAC is formed only on the side face of the gate of the memory cell transistor, it is possible to provide a large distance between the sidewalls in a bottom surface portion of the SAC. That is, the distance depends upon the film thickness of the sidewall and the distance between the gates, and the thinner the sidewall, the larger the distance between the sidewalls. Since the wider the bottom surface of the SAC is, the larger the distance between the sidewalls is, it is possible to obtain a stable contact resistance. In the conventional structure, the total thickness of sidewall resulting from two sidewall formations is 0.3 μm, the distance between the gates is 0.8 μm, and therefore the distance between the sidewalls is 0.8−(0.3×2)=0.2 μm. In the present invention, however, the thickness of the sidewall resulting from a single sidewall formation is 0.2 μm, and therefore the distance between the sidewall is 0.8−(0.2×2)=0.4 μm which is twice the distance of the conventional structure. If the distance between the sidewalls is allowed to be 0.2 μm, it is possible in the present invention to reduce the distance between the gates by 0.2 μm, thereby leading to miniaturization of the cell size.

(4) Since the peripheral circuit region is covered by the first interlayer insulating layer during introduction of impurity into the cell source/drain region, it is possible to eliminate the photolithographic step dedicated to the impurity introduction into the source/drain region of the cell.

What is claimed is:

1. A method of manufacturing a non-volatile semiconductor memory device having a non-volatile memory transistor and a peripheral transistor, the method comprising the following steps:

selectively forming an insulating layer on a semiconductor substrate to define a peripheral circuit active region and a memory cell active region on said semiconductor substrate, forming a first gate insulating layer on said peripheral circuit active region, covering said memory cell active region with a first mask layer, forming said peripheral transistor in said peripheral circuit active region while leaving said first mask layer covering said memory cell active region, said peripheral transistor having a first gate electrode formed on said first gate insulating layer and source and drain regions selectively formed in said peripheral circuit active region, covering said peripheral transistor with a second mask layer, removing said first mask layer from said memory cell active region, forming a second gate insulating layer on said memory cell active region, and forming said non-volatile memory transistor while leaving said second mask layer covering said peripheral transistor, said non-volatile memory transistor having a second gate electrode formed on said second gate insulating layer and source and drain regions selectively formed in said memory cell active region.

2. The method of manufacturing a non-volatile semiconductor memory device, as claimed in claim 1, wherein said second gate electrode of said non-volatile memory transistor includes a floating gate formed on said second gate insulating layer and a control gate formed over said floating gate with intervention of an insulating film therebetween.

3. The method of manufacturing a non-volatile semiconductor memory device, as claimed in claim 1, wherein said step of forming said peripheral transistor comprises the following steps:

forming a low impurity density diffusion layer by injecting impurity by using said first gate electrode as a mask, said first gate electrode having a side face, forming a sidewall on said side face of said first gate electrode, and forming a high impurity density diffusion layer by injecting impurity by using said sidewall and said first gate electrode as a mask.

4. A method of manufacturing a non-volatile semiconductor memory device, comprising the following steps:

forming a first active region for a peripheral circuit and a second active region for a memory cell on a surface of a semiconductor substrate of a first conductivity type by providing an element-isolating insulating layer thereon, forming a first gate by forming a first gate insulating layer on a surface of said first active region, depositing a first electrode layer on said first gate insulating layer and patterning said first electrode layer, forming an MOS transistor having an LDD structure by forming a low impurity density diffusion layer of a second conductivity type in alignment with said first gate by ion-injecting said second conductivity type impurity while using a mask to cover said second active region, forming a first insulating layer on a side face of said first gate, and forming a high impurity density diffusion layer of said second conductivity type in said semiconductor substrate in alignment with said first insulating layer, wherein said second conductivity type is opposite to said first conductivity type, forming a first interlayer insulating layer selectively on the surface of said first active region including said first gate, after forming said interlayer insulating layer, forming a second gate comprising a control gate and a floating gate in said second active region by forming a second gate insulating layer on the surface of said second active region, sequentially depositing, on the surface including said second gate insulating layer, a second electrode layer, a third gate insulating layer, a third electrode layer, and a second insulating layer, and anisotropically and sequentially etching said second insulating layer, said third electrode layer, said third gate insulating layer, and said second electrode layer selectively, and forming a memory cell transistor by forming a source/drain region by ion injecting an impurity of said second conductivity type into said semiconductor substrate by using said second gate as a mask.

5. The method of manufacturing a non-volatile semiconductor memory device, as claimed in claim 4, further comprising the steps of:

depositing a third insulating layer on the surface including said second gate, etching said third insulating layer to leave a portion of said third insulating layer on a side face of said second gate and to expose only a surface of a source region of said memory cell transistor; and selectively forming a source electrode connected electrically to said source region.

6. The method of manufacturing a non-volatile semiconductor memory device, as claimed in claim 4, wherein said third gate insulating layer is composed of a three layer structure including a first silicon dioxide layer, a silicon nitride layer and a second silicon dioxide layer.

7. The method of manufacturing a non-volatile semiconductor memory device, as claimed in claim 4, wherein said control gate has a polycide structure.

* * * * *